(12) United States Patent
Cadugan et al.

(10) Patent No.: US 9,625,534 B2
(45) Date of Patent: Apr. 18, 2017

(54) SYSTEMS AND METHODS FOR DETECTION OF MAGNETIC FIELDS

(71) Applicants: Bryan Cadugan, Bedford, NH (US); Michael C. Doogue, Manchester, NH (US)

(72) Inventors: Bryan Cadugan, Bedford, NH (US); Michael C. Doogue, Manchester, NH (US)

(73) Assignee: Allegro MicroSystems, LLC, Worcester, MA (US)

( * ) Notice: Subject to any disclaimer, the term of this patent is extended or adjusted under 35 U.S.C. 154(b) by 852 days.

(21) Appl. No.: 13/682,921

(22) Filed: Nov. 21, 2012

(65) Prior Publication Data

US 2014/0139213 A1  May 22, 2014

(51) Int. Cl.
*G01R 33/00* (2006.01)
*G01R 33/07* (2006.01)
*G01R 33/09* (2006.01)

(52) U.S. Cl.
CPC .......... *G01R 33/0023* (2013.01); *G01R 33/07* (2013.01); *G01R 33/09* (2013.01)

(58) Field of Classification Search
CPC .................................................... G01D 5/2448
See application file for complete search history.

(56) References Cited

U.S. PATENT DOCUMENTS

| 5,039,945 | A | * | 8/1991 | Webb | 324/253 |
|---|---|---|---|---|---|
| 6,043,646 | A | | 3/2000 | Jansseune | |
| 6,522,131 | B1 | * | 2/2003 | Hiligsmann | G01D 3/02 324/174 |
| 6,694,828 | B1 | * | 2/2004 | Nicot | B62D 1/16 180/422 |
| 7,112,955 | B2 | | 9/2006 | Buchhold | |
| 7,112,957 | B2 | | 9/2006 | Bicking | |
| 7,385,394 | B2 | | 6/2008 | Auburger et al. | |
| 7,839,141 | B2 | | 11/2010 | Werth et al. | |

(Continued)

OTHER PUBLICATIONS

Allegro Microsystems, Inc. Datasheet; "A3209 and A3210 Micropower, Ultra-Sensitive Hall-Effect Switches;" no date available; pp. 1-10.

(Continued)

*Primary Examiner* — Jermele M Hollington
*Assistant Examiner* — Dustin Dickinson
(74) *Attorney, Agent, or Firm* — Daly, Crowley, Mofford & Durkee, LLP

(57) ABSTRACT

Apparatuses for detecting the strength of magnetic fields may include a first magnetic field detection circuit that produces a first signal indicating a strength of a magnetic field, and a second magnetic field detection circuit that can be turned on and off, and produces a second signal indicating the strength of the magnetic field. A control circuit may be configured to determine whether the first signal indicates a change greater than a predetermined amount in the strength of the magnetic field. If the change is greater than the predetermined amount, the control circuit may turn on the second magnetic field detection circuit. The control circuit may turn off the second magnetic field detection circuit to conserve power if the strength of the magnetic field is relatively stable. Methods for detecting the strength of the magnetic field are also disclosed.

23 Claims, 7 Drawing Sheets

(56) References Cited

U.S. PATENT DOCUMENTS

| | | | |
|---|---|---|---|
| 7,923,996 B2 | 4/2011 | Doogue et al. | |
| 7,956,604 B2 | 6/2011 | Ausserlechner | |
| 8,008,908 B2 | 8/2011 | Doogue et al. | |
| 8,030,918 B2 | 10/2011 | Doogue et al. | |
| 8,058,870 B2 | 11/2011 | Sterling | |
| 8,080,993 B2 | 12/2011 | Theuss et al. | |
| 8,106,654 B2 | 1/2012 | Theuss et al. | |
| 8,222,888 B2 | 7/2012 | David et al. | |
| 8,253,210 B2 | 8/2012 | Theuss et al. | |
| 8,362,579 B2 | 1/2013 | Theuss et al. | |
| 8,610,430 B2 | 12/2013 | Werth et al. | |
| 8,773,124 B2 | 7/2014 | Ausserlechner | |
| 8,862,328 B2* | 10/2014 | Gebregergis | B62D 5/0418 180/443 |
| 9,116,018 B2 | 8/2015 | Frachon | |
| 9,164,156 B2 | 10/2015 | Elian et al. | |
| 9,201,123 B2 | 12/2015 | Elian et al. | |
| 2006/0112290 A1* | 5/2006 | Yamamoto et al. | 713/300 |
| 2010/0127700 A1* | 5/2010 | Sugiura | B82Y 25/00 324/251 |
| 2011/0127998 A1 | 6/2011 | Elian et al. | |
| 2011/0231119 A1* | 9/2011 | Cohen et al. | 702/56 |
| 2011/0267040 A1 | 11/2011 | Frachon | |
| 2012/0062222 A1* | 3/2012 | Watanabe | G01R 33/072 324/251 |
| 2012/0182658 A1* | 7/2012 | Motz | G01P 3/489 361/91.5 |
| 2012/0249124 A1* | 10/2012 | Ionescu | G01R 33/072 324/207.2 |
| 2012/0263985 A1* | 10/2012 | Murata et al. | 429/90 |
| 2013/0033260 A1* | 2/2013 | Nomura | 324/252 |
| 2013/0271112 A1* | 10/2013 | Vazach | G01D 5/2448 324/76.19 |
| 2013/0278246 A1 | 10/2013 | Stegerer et al. | |

OTHER PUBLICATIONS

Allegro Microsystems, Inc. Datasheet; "A3211 and A3212 M Micropower, Ultrasensitive Hall-Effect Switches;" Jan. 2002; pp. 1-12.

Allegro Microsystems, Inc. Datasheet; "A1171 Micropower Ultrasensitive Hall Effect Switch;" Jan. 2005; pp. 1-10.

Allegro Microsystems, Inc. Datasheet; "A1172 Micropower Ultra-Sensitive Hall-Effect Switch;" Jan. 2008; pp. 1-11.

Allegro Microsystems, Inc. Datasheet; "A1174 Ultrasensitive Hall Effect Latch with Internally or Externally Controlled Sample and Sleep Periods for Track Ball and Scroll Wheel Applications;" Jan. 2008; pp. 1-13.

* cited by examiner

SYSTEMS AND METHODS FOR DETECTION OF MAGNETIC FIELDS

FIELD

This application relates to detection of magnetic fields and, more particularly, to low power systems and methods for detecting the strength of a magnetic field or flux.

BACKGROUND

Detection of magnetic fields is used in various industries. For example, magnetic field detection is used in robotics and other electromechanical disciplines to determine the speed or position of a motor, the location of an actuator, the proximity of a magnet, etc.

Various types of sensors can be used to detect the strength of a magnetic field. These include Hall effect sensors, magnetoresistance sensors, giant magnetoresistance (GMR) sensors, and the like. Many magnetic detection sensors consume power as long as power is applied to the sensor. This is true even when the magnetic field they are detecting is unchanging. This constant power consumption can cause problems in applications that require low power consumption, such as battery- or solar-powered applications. If a particular application requires low power consumption, it may be desirable to reduce the amount of power consumed by circuits or sensors that detect a magnetic field.

SUMMARY

In an embodiment, an apparatus for detecting the strength of a magnetic field includes a first magnetic field detection circuit that produces a first signal indicating a strength of a magnetic field. The apparatus also includes a second magnetic field detection circuit that selectively receives a power signal and produces a second signal indicating the strength of the magnetic field. The second signal may provide a more accurate indication of the strength of the magnetic field than the first signal. A control circuit is configured to determine whether the first signal indicates a change greater than a predetermined amount in the strength of the magnetic field. If the change is greater than the predetermined amount, the control circuit may couple the power signal to the second magnetic field detection circuit.

In various embodiments, the first magnetic field detection circuit consumes less power than the second magnetic field detection circuit. In various embodiments, the output of the apparatus may be a linear signal or a switched signal.

In another embodiment, a method for detecting the strength of a magnetic field includes producing, with a first magnetic field detection circuit, a first signal indicating a strength of a magnetic field, determining whether the first signal indicates a change in the magnetic field greater than a predetermined amount, and producing a second, more accurate signal indicating the strength of the magnetic field. The method also includes providing power to a second magnetic field detection circuit that produces the second signal if the first signal indicates a change in the magnetic field greater than the predetermined amount.

In various embodiments, the method also includes removing power from the second magnetic field detection circuit if the second signal is at a steady state or if the signal crosses a switching threshold. The method may also produce a linear or switched output signal in response to the magnetic field.

BRIEF DESCRIPTION OF THE DRAWINGS

Embodiments of the technology may be illuminated by the following figures.

Figure 1:
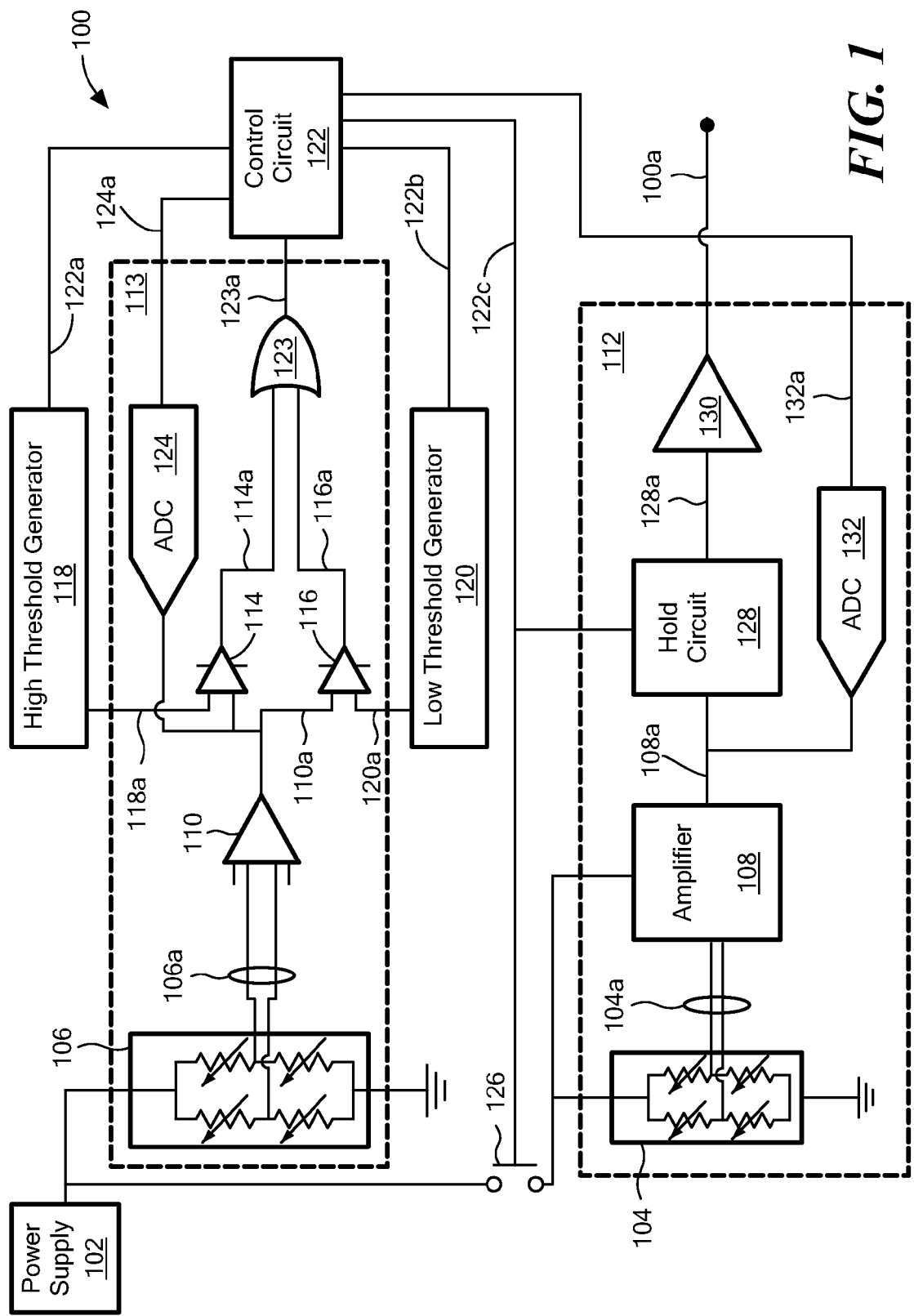
FIG. 1 is a block diagram of an embodiment of a linear output circuit for detecting a magnetic field according to an embodiment.

Like reference numbers in the figures indicate like elements. Also, one skilled in the art will recognize that the figures are examples provided to describe the technology and do not limit the scope of the invention. Accordingly, charts and waveforms, as well as blocks within the block diagrams and flow charts, may be replaced, combined, split, and rearranged with other blocks and elements without limitation.

DETAILED DESCRIPTION

In various embodiments, an electronic circuit is provided that detects a magnetic field. The circuit may be a magnetic field sensor circuit that can sense the strength of a magnetic field (e.g. a magnetic flux) and generate an output signal that represents the magnetic field strength. The circuit may be configured to reduce power consumption, and may be suitable for but not limited to applications such as battery powered applications where low power is advantageous.

In an embodiment, the circuit may include a first, low power magnetic field detection circuit configured to operate at a low power level to detect the magnetic field and provide a signal representing the strength of the magnetic field. Since it operates at low power, the signal produced by the low power magnetic field detection circuit may not be as accurate as a signal produced by a higher power magnetic field detection circuit. For example, the circuit may include noise or other aberrations that reduce the accuracy of the signal. However, even if the signal is less accurate than a signal produced by a higher power detection circuit, the signal may be used to detect gross changes in the strength of the magnetic field.

The electronic circuit may also include a second magnetic field detection circuit. The second magnetic field detection circuit may consume a greater amount of power in order to produce a more accurate signal representing the strength of the magnetic field. Such a signal may be used to produce an output signal with relatively less noise, i.e. a relatively "clean" output that is representative of the strength of the magnetic field.

However, in order to reduce power consumption of the electronic circuit, it may be beneficial to turn the second magnetic field detection circuit off (i.e. decouple power from the circuit) when it is not needed. For example, if the strength of the magnetic field is relatively stable and unchanging, power can be removed from the second magnetic field detection circuit and the output of the circuit can be held at the stable level until the strength of the magnetic field changes beyond a predetermined amount. Accordingly, the electronic circuit may contain a control circuit configured to determine, based on the output of the low power magnetic field detection circuit, whether the strength of the magnetic field is stable or changing. If the strength is stable, the control circuit can reduce power consumption by turning the second magnetic field defection circuit off and buffering its output. If the strength is changing, the control circuit can provide power to the second magnetic field detection circuit so that the output of the electronic circuit can track the changes in the magnetic field.

Referring to FIG. 1, an electronic circuit 100 for sensing a magnetic field is shown. In an embodiment, a power supply 102 may provide power to the electronic circuit 100. The electronic circuit 100 may be configured to provide a linear output signal 100a representing the strength of a magnetic field. In various embodiments, the power supply 102 may be a DC voltage regulator that provides a constant voltage to the electronic circuit 100. In other embodiments, the power supply 102 may be a constant current source, a battery, an AC source, or any desired type of power supply. In FIG. 1, the power supply 102 is shown coupled to a giant-magnetoresistive (GMR) bridge 104, a GMR bridge 106, and an amplifier 108. However, the power supply 102 may also provide power to the other elements of the circuit 100 and/or other circuits or elements not shown in FIG. 1.

In certain embodiments, the GMR bridge 104 may be coupled to provide an accurate signal 104a to the amplifier 108 representing the strength of a magnetic field sensed by the GMR bridge 104. Because the amplifier 108 will amplify any noise or artifacts present in the low power signal 106a, the amplifier 110 may include filters or other mechanisms to reduce such noise. These filters and mechanisms may also consume power so long as power is provided to the amplifier block 108, Similarly, the GMR bridge 106 may be coupled to provide a signal 106a to an amplifier 110 representing the strength of the magnetic field sensed by the GMR bridge 106. In an embodiment, because the amplifier 110 will amplify any noise or artifacts present in the low power signal 106a, the amplifier 110 may include filters or other mechanisms to reduce such noise. The GMR bridge 104 and the GMR bridge 106 may include magnetic flux concentrators or other mechanisms to adjust or enhance sensitivity. While the GMR bridges 104 and 106 are shown as formed by a full (Wheatstone) bridge arrangement of four GMR elements, it will be appreciated by those of ordinary skill in the art that the GMR bridges may alternatively be comprised of only a single magnetic field sensing element or a plurality of elements in various configurations, such as a half bridge arrangement. In another embodiment, the GMR bridge 104 or the GMR bridge 106 can be replaced by two GMR resistors in parallel, each receiving equal, constant current, and each feeding into an amplifier.

Thus, the bridges 104 and 106 may be referred to more generally as magnetic field detection circuits 104, 106, respectively. For example, instead of including GMR elements as shown, circuits 104, 106 may comprise different types of magnetic field sensing elements, such as Hall effect elements, magnetoresistance elements, or magnetotransistors. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ).

Additionally, it will be appreciated that the two bridges 104, 106 need not contain the same type of magnetic field sensing element(s) or the same configuration of multiple elements. In alternate embodiments, the GMR bridge 104 or the GMR bridge 106 may be replaced with an AMR bridge, a Hall effect element, or other components or circuits for detecting a magnetic field. One embodiment may use a low powered Hall plate in place of the GMR bridge 106 and use an AMR or GMR bridge for a more accurate measurement of the magnetic field. Another embodiment, which may also be used as an angle sensor, may use Circular Vertical Hall (CVH) for the elements 106 and an AMR sensor or GMR sensor element or bridge 104 for the more accurate measurement.

In an embodiment, the GMR bridge 106 and the GMR bridge 104 may be placed in proximity to one another so that they are subjected to the same ambient magnetic field, and thus provide signals representative of the same magnetic field.

In some embodiments, the GMR bridge 106 may be a low power GMR bridge. In other words, the GMR bridge 106 may be configured to consume relatively less power than the GMR bridge 104. For example, the elements within the GMR bridge 106 may be more highly resistive than those in the GMR bridge 104, which may result in the GMR bridge 106 consuming less power. As a result, because the GMR bridge 106 consumes less power, the signal 106a may not be as accurate a representation of the strength of the magnetic field as the accurate signal 104a. As one example, the bridge 106 may have a resistance on the order of 5 MΩ or more and may draw approximately 1 µA or less. In contrast, the GMR bridge 104 may be configured to consume more power so that the GMR bridge 104 can produce a more accurate signal 104a representing the strength of the magnetic field. As such, the GMR bridge 104 may be part of a so-called accurate signal path 112 and the GMR bridge 106 may be part of a so-called low power signal path 113, as will be discussed below.

The amplifier 110 may produce a signal 110a, which may be an amplified representation of the strength of the magnetic field. The signal 110a may be received by a comparator 114 and a comparator 116. The comparator 114 may be coupled to also receive a signal 118a representing a high threshold produced by a high threshold generator 118. Comparator 114 can generate a signal 114a that indicates whether the signal 110a (i.e. the strength of the magnetic field) has crossed the high threshold. In some embodiments, the amplifier 110 may not be needed and may be omitted to reduce power consumption.

Similarly, the comparator 116 may be coupled to receive the signal 110a and the signal 120a representing a low threshold produced by a low threshold generator 120. Comparator 116 can generate a signal 116a that indicates whether the signal 110a (i.e. the strength of the magnetic field) has crossed the low threshold.

The high threshold generator 118 and the low threshold generator 120 may be coupled to receive signals 122a and 122b, respectively, from control circuit 122. Signals 122a and 122b may be signals that instruct the high threshold generator 118 and the low threshold generator 120 to generate thresholds, which will be discussed below in greater detail.

The circuit 100 may also include an OR gate 123, which may be coupled to receive signals 114a and 116a and to produce a signal 123a. The signal 123a may indicate whether the strength of the magnetic field has crossed either the high threshold (generated by high threshold generator 118) or the low threshold (generated by low threshold generator 120).

The circuit 100 may also include an analog-to-digital converter (ADC) 124, which may be coupled to receive the signal 110a and produce a signal 124a. In an embodiment, the signal 124a may be a digital representation of the strength of the magnetic field. In other embodiments, the signal 124a may be an analog signal.

In an embodiment, the low power path 113 may include low power components. For example, the GMR bridge 106 may be a high resistance GMR bridge that consumes a very small amount of power. In other embodiments, components such as the amplifier 110 may be an amplifier configured to consume low power. Alternatively, the amplifier 110 may be omitted from the electronic circuit 100 to reduce power consumption, if desired. Similarly, the comparators 114 and 116, the gate 123, and the ADC 124 may be low power components so that the low power path 113 consumes as little power as possible. In other embodiments, components such as the comparators 114 and 116, the gate 123, and the ADC 124 can be omitted or replaced by alternative circuits that consume low power in order to minimize power consumption by the low power path 113.

As shown, the control circuit 122 may be coupled to receive signal 124a (representing the strength of the magnetic field) and signal 123a (representing whether the strength of the magnetic field has crossed a threshold). As discussed above, the control circuit may also be coupled to provide the signal 122a to the high threshold generator 118 and the signal 122b to the low threshold generator 120.

The control circuit 122 may also provide a power control signal, or simply a control signal 122c, to a switch 126 and a hold circuit 128. The control signal 122c may control whether the switch 126 is open or closed. As shown, one side of the switch 126 may be coupled to the power supply 102 and the other side of the switch 126 may be coupled to the accurate GMR bridge 104, the amplifier 108, or other elements of the accurate signal path 112. In this configuration, when the control circuit 122 opens the power switch 126, power may be removed from the accurate GMR bridge 104, the amplifier 108, and any other circuits or components coupled to switch 126. In embodiments, the switch 126 may be a normally open switch or a normally closed switch depending upon the circuit design, so long as the switch 126 can be opened in order to remove power, and closed to provide power to the accurate GMR bridge 104, the amplifier 108, and any other circuits or components coupled to switch 126. In some scenarios, for example where the accurate GMR bridge 104 should be powered greater than 50% of the time, a normally closed switch may draw less power than a normally open switch.

Although depicted as a mechanical switch, switch 126 may be any type of switch capable of decoupling or isolating the power supply 102 from the GMR bridge 104, the amplifier 108, or other elements of the accurate signal path 112. In various embodiments, the switch 126 may be a mechanical switch, a transistor, a series of transistors, a solid state switch, a solenoid, an electromechanical switch, a MEMS switch, a micromachined relay or switch, or any type of switch that can be opened and closed by a control signal 122c. In some embodiments, the switch 126 may be a silicon-based switch, such as a silicon power switch or silicon field-effect transistor (FET), that can be on the same silicon die as other components of the electronic circuit 100. In another embodiment, the switch 126 may be on a separate silicon die, but placed in the same package as another silicon die that includes sensing elements, transducers, or other elements of the electronic circuit 100.

As noted above, the accurate signal path 112 may include GMR bridge 104 and amplifier 108. The amplifier 108 may produce an accurate signal 108a, which may be an amplified signal representing the strength of the magnetic field.

The hold circuit 128 may be coupled to receive the amplified accurate signal 108a and produce an output signal 128a. In some instances, when the amplifier 108 and the GMR bridge 104 are receiving power, the output signal 128a may be the same as, or may track, the accurate signal 108a. In other instances, when the amplifier 108 and the GMR bridge 104 are not powered, the signal 128a may be held at a constant value by hold circuit 128. In an embodiment, the constant value may be a previous value of the accurate signal 108a that was produced by amplifier 108 prior to amplifier 108 being decoupled from power. As an example, the hold circuit 128 may be a buffer having an input, and an output that can either track the input or hold a constant value based on a previous value of the input.

The control signal 122c generated by control circuit 122 may be received by hold circuit 128 and may cause the hold circuit 128 to provide the output signal 128a as a tracked version of the accurate signal 108a when the switch 126 is closed and to provide the output signal 128a at a held, constant value when the switch 126 is open.

The signal 128a may be fed to an output buffer 130 which may amplify or buffer the signal 128a and produce the output signal 100a. In some embodiments, the output signal 100a varies linearly with the strength of the sensed magnetic field, the circuit 100 can be referred to as a linear or linear output magnetic field sensor. The ADC 132 may convert the accurate signal 108a (representing the strength of the magnetic field) into digital signal 132a and feed it back to control circuit 122, as shown. In other embodiments, an analog signal representing the strength of the magnetic field may be fed back to the control circuit 122, which may include a comparator for comparing the analog signal to another signal.

Figure 1B:
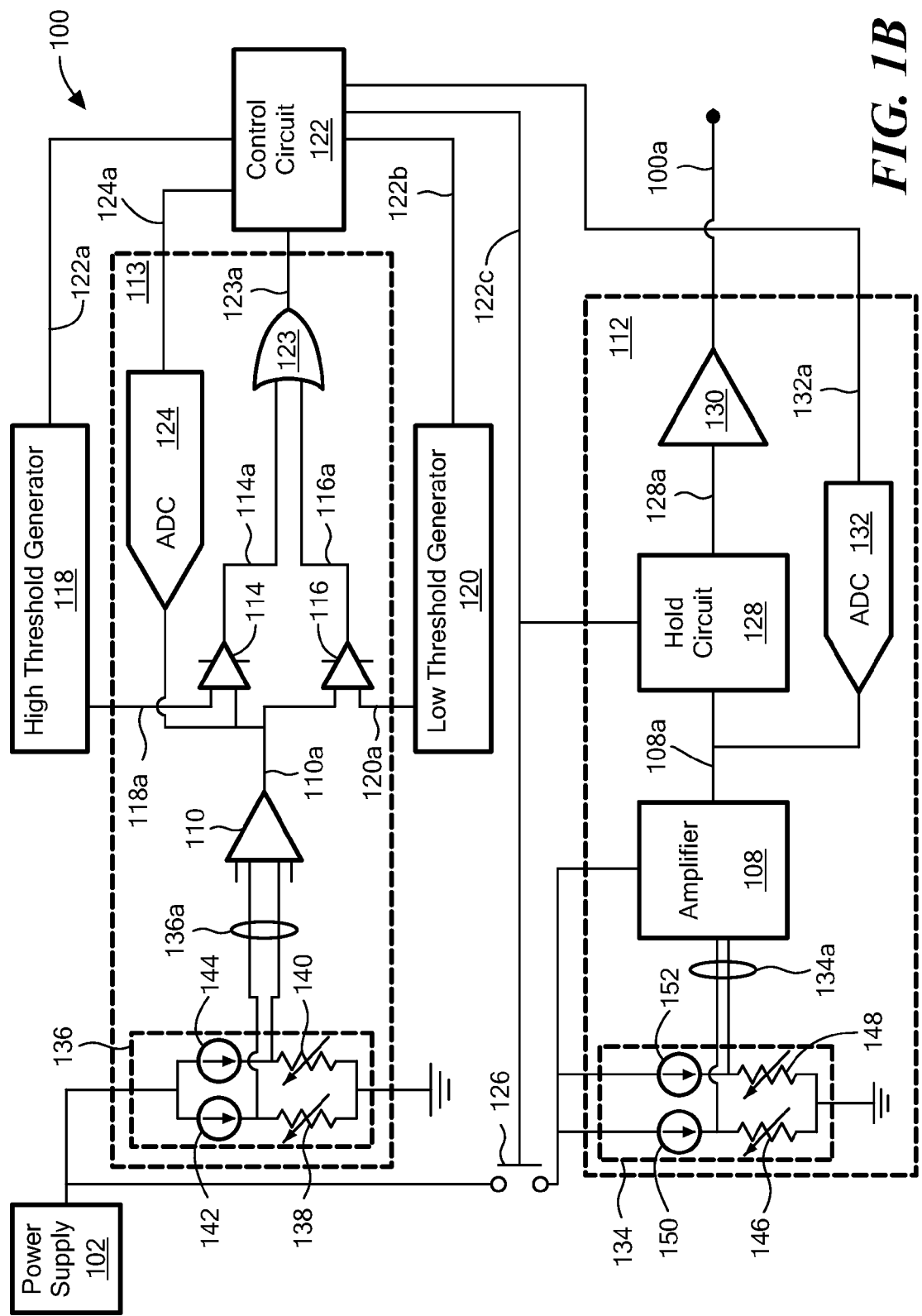
FIG. 1B is a block diagram of an embodiment of a linear output circuit for detecting a magnetic field according to an embodiment.

FIG. 1B illustrates an alternate embodiment of the electronic circuit 100 where the GMR bridge 104 has been replaced by a GMR half bridge 134 and the GMR bridge 106 has been replaced by a GMR half bridge 136. The GMR half bridge 136 may include a GMR resistor 138 and a GMR resistor 140. The GMR resistors 138 and 140 are shown coupled to ground. However, instead of a ground connection, the GMR resistors 138 and 140 may be coupled to any appropriate voltage source. A current source 142 may be coupled to drive current through the GMR resistor 138 and a current source 144 may be coupled to drive current through the GMR resistor 140. The current sources 142 and 144 may be configured to drive an appropriate current through the GMR resistors 138 and 140, respectively. In an embodiment, the current may be 1 mA, 2 mA, 5 mA, or any desired current. The current sources 142 and 144 may also be configurable so that the current source 142 and the current source 144 drive different currents with the same value, or drive currents with different values, if desired. The resulting voltage across the GMR resistor 138 and the resulting voltage across the GMR resistor 140 may comprise an output signal 136a that is received by the amplifier 110. The output signal 136a may represent and be responsive to the strength of the magnetic field.

The GMR half bridge 134 also includes a GMR resistor 146 and 148. The GMR resistors 146 and 148 are shown coupled to ground. However, instead of a ground connection, the GMR resistors 146 and 148 may be coupled to any appropriate voltage source. A current source 150 may be coupled to drive current through the GMR resistor 146 and a current source 152 may be coupled to drive current through the GMR resistor 148. In an embodiment, the current may be 1 mA, 2 mA, 5 mA, or any desired current. The current sources 150 and 152 may also be configurable so that the current source 150 and the current source 152 each drive currents with the same value, or drive currents with different values, if desired. The resulting voltage across the GMR resistor 146 and the resulting voltage across the GMR resistor 148 may comprise an output signal 134*a* that is received by the amplifier 108. The output signal 134*a* may represent and be responsive to the strength of the magnetic field.

In an embodiment, the GMR half bridge 134 included in the accurate signal path 112 may be an accurate GMR half bridge and the GMR half bridge 136 included in the low power path may be a low power GMR half bridge. For example, the current sources 142 and 144 of the low power GMR half bridge 136 may be configured to provide a low current in order to preserve power. Similarly, the GMR resistors 138 and 140 may have a low resistance in order to limit power consumption. In contrast, the current sources 150 and 152 may be configured to produce a relatively higher current, and/or the GMR resistors 146 and 148 may have a relatively higher resistance. In such a configuration, the GMR half bridge 134 may consume relatively more power than the GMR half bridge 136, but may also produce a more accurate output signal 134*a* than the output signal 136*a*.

Figure 2:
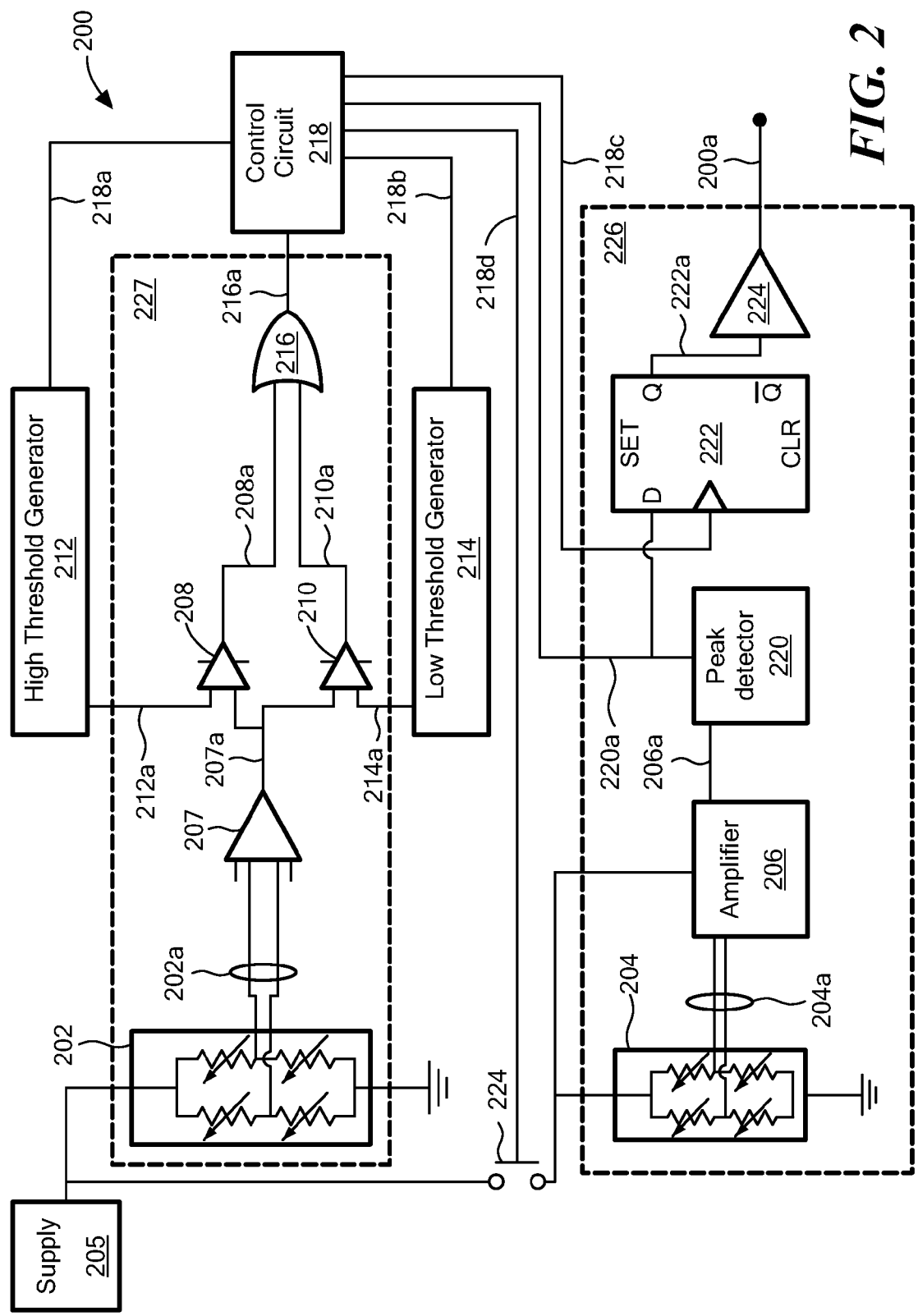
FIG. 2 is a block diagram of a switched output circuit for detecting a magnetic field according to an embodiment.

Referring now to FIG. 2, a switched circuit 200 for detecting the strength of a magnetic field is shown. Like the circuit 100, the circuit 200 includes a low power GMR bridge 202 for detecting a change in the strength of the magnetic field and an accurate GMR bridge 204 for producing an accurate signal representing the strength of the magnetic field. In contrast to circuit 100, circuit 200 produces a switched output 200*a*, rather than a linear output 100*a*.

The GMR Bridge 202 and the GMR bridge 204 may be placed in proximity to one another to detect the same magnetic field. In an embodiment, the GMR bridge 204 may be included in a so-called accurate signal path 226 and the GMR bridge 202 may be included in a so-called low power signal path 227. The accurate signal path 226 may produce a signal, e.g. output signal 200*a*, that represents the strength of the magnetic field. Elements within the accurate signal path 227 may also be selectively coupled and decoupled to the power supply 205 in order to conserve power.

Although not shown, the GMR Bridge 202 and the GMR bridge 204 may be replaced by GMR half bridges, such as the GMR half bridges 136 and 134 described above in relation to FIG. 1B.

The low power signal path 227 may also produce a signal representing the strength of the magnetic field (i.e. amplified signal 207*a*, for example). The low power signal path 227, in an embodiment, may consume relatively less power or lower current levels than the accurate signal path 226 and may be used to detect whether the strength of the magnetic field has changed by more than a predetermined amount, as will be discussed below.

The circuit 200 includes a power supply 205 coupled to provide power to the GMR bridge 202, the GMR bridge 204, and an amplifier 206. Although not shown, the power supply 205 may also provide power to the other elements of the circuit 200 or to other circuits and elements not shown in FIG. 2. The power supply 205 may be a voltage regulator, a battery, a current regulator, a power regulator, or any type of power supply that can provide power to circuit 200.

The low power GMR bridge 202 may be coupled to provide a signal 202*a* to an amplifier 207. The signal 202*a* may represent the strength of the magnetic field. Similarly, the accurate GMR bridge 204 may be coupled to provide a signal 204*a* to amplifier 206. The signal 204*a* may also represent the strength of the magnetic field.

In an embodiment, the low power GMR bridge 202 may be configured to consume less power than the accurate GMR bridge 204. For example, the resistive elements within the GMR bridge 202 may provide a relatively high resistance so that the GMR bridge 202 consumes less power. In another embodiment, the low power GMR bridge 202 may be configured to rapidly switch on and off so that it consumes relatively less power.

Because the low power GMR bridge 202 consumes less power, the signal 202*a* produced by the low power GMR bridge 202 may contain noise or other signal artifacts and may provide a less accurate representation of the strength of the magnetic field than the signal 204*a*. Accordingly, in an embodiment, the signal 202*a* may be used to detect changes in the strength of the magnetic field while the accurate signal 204*a* may be used to provide a more accurate representation of the strength of the magnetic field.

The amplifier 207 may receive the low power signal 202*a*, amplify the low power signal 202*a*, and produce signal 207*a*. The signal 207*a* may be an amplified version of the low power signal 202*a* and may also represent the strength of the magnetic field. In an embodiment, because the amplifier 207 will amplify any noise or artifacts present in the low power signal 202*a*, the amplifier 207 may include filters or other mechanisms to reduce such noise. In some embodiments, the amplifier 207 may not be required and may be omitted in order to reduce power consumption.

The amplified signal 207*a* may be fed into a comparator 208 and a comparator 210. The comparator 208 may be coupled to receive a high threshold signal 212*a* from a high threshold generator 212. The comparator 208 may also be configured to produce a signal 208*a* that represents whether the amplified, low power signal 206*a* has crossed the high threshold. Similarly, the comparator 210 may be coupled to receive a low threshold signal 214*a* from a low threshold generator 214. Use comparator 210 may also be configured to produce a signal 210*a* that represents whether the amplified, low power signal 206*a* has crossed the low threshold.

The circuit 200 may also include an OR gate 216 coupled to receive the signal 208*a* and the signal 210*a*. The OR gate 216 may produce a signal 216*a* that indicates whether the amplified, low power signal 206*a* has either crossed the high threshold provided by the high threshold generator 212 or the low threshold provided by the low threshold generator 214.

The circuit 200 may also include a control circuit 218. The control circuit 218 may be coupled to receive the signal 216*a* from the OR gate 216 and a peak detection signal 220*a* from a peak detector 220. The peak detection signal 220*a* may indicate that the accurate signal 206*a* has reached or crested a peak and most generally generates an output signal 220*a* that changes state each time the accurate signal 206*a* either reaches a peak (i.e., positive or negative peak, which may alternatively be referred to as a peak or a trough or a peak or a valley) or crosses a threshold level. Various types of peak detectors are suitable. In one type of peak detector (sometimes referred to as a peak-to-peak percentage detector), a threshold level is equal to a percentage of the peak-to-peak magnetic field signal. One such peak-to-peak percentage detector is described in a U.S. Pat. No. 5,917,320 entitled "Detection of Passing Magnetic Articles while Periodically Adapting Detection Threshold" (incorporated herein by reference in its entirety and assigned to the assignee of the present invention). Another type of peak detector, sometimes referred to as slope-activated detector or a peak-referenced detector, is described in U.S. Pat. No. 6,091,239 entitled "Detection of Passing Magnetic Articles with a Peak Referenced Threshold Detector" (incorporated herein by reference in its entirety and assigned to the assignee of the present invention). In the peak-referenced detector, the threshold signal differs from the peak of the magnetic field signal by a predetermined amount. Thus, in this type of detector, the output signal 220a changes state when the signal 206a comes away from a peak or valley by the predetermined amount.

The control circuit 218 may be coupled to provide a high threshold control signal 218a to high threshold generator 212 and a low threshold control signal 218b to low threshold generator 214. The high threshold control signal 218a and the low threshold control signal 218b, when asserted, may initiate generation of the high threshold by the high threshold generator 212 and generation of the low threshold by the low threshold generator 214. The control circuit 218 may also be coupled to provide an enable signal 218c to a latch 222.

The control circuit 218 may also provide a control signal 218d, which may be received by a power switch 224. The control signal 218d may control whether the power switch 224 is open or closed. As shown, one side of the switch 224 may be coupled to the power supply 205 and the other side of the switch 224 may be coupled to the accurate GMR bridge 204, the amplifier 206, or other elements of the accurate signal path 226. In this configuration, when the control circuit 218 opens the power switch 224, power may be removed from the accurate GMR bridge 204, the amplifier 206, and any other circuits or components coupled to switch 224. For example, although not shown, the peak detector 220 may be coupled to the switch 224 so that, when the switch 224 is open, power is removed from the peak detector 220.

The electronic circuit may also include an output latch 222 which may receive the output signal 220a from the peak detector 220. When the control circuit 218 asserts the enable signal 218c the latch 222 may latch the value of the output signal 220a as the output 222a. As noted, the output signal 220a may represent peaks and valleys in the amplified signal 206a. Thus, the output 222a may also represent peaks and valleys in the strength of the magnetic field, and thus may represent the strength of the magnetic field.

Although shown as a D flip-flop, the latch 222 may be any type of buffer including an analog output buffer, a digital output buffer, a flip-flop, a logical gate latch, etc. In some embodiments, the latch 222 may provide a switched output that can be toggled between two states (typically a high state and a low state). In other embodiments, the latch 222 may provide a digital or analog output that can be held at a particular level.

In an embodiment, the electronic circuit 200 may also include an output driver 224 that receives signal 222a and provides the output signal 200a.

Figure 3:
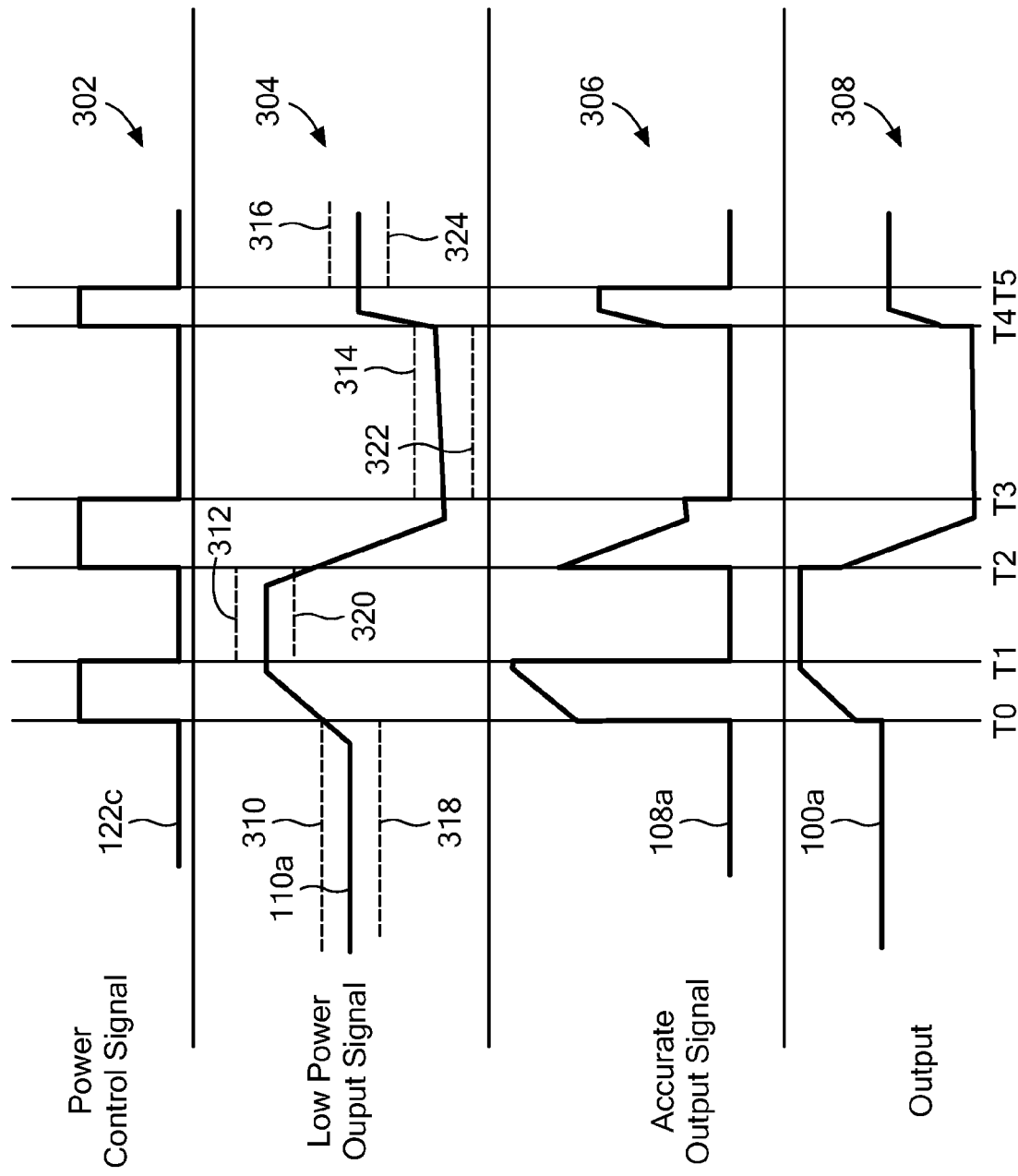
FIG. 3 is a series of waveforms depicting voltages at various nodes within the linear output circuit of FIG. 1.

Turning now to FIG. 3, a series of waveforms 302, 304, 306, and 308 associated with the linear output circuit 100 of FIG. 1 are shown. For each waveform, the vertical axis represents voltage. Also, each waveform in FIG. 3 shares a common horizontal axis that represents time. The labels T0-T5 along the horizontal axis denote points in time corresponding to the vertical lines within FIG. 3. It should be noted that FIG. 3 shows approximate timings for the waveforms 302, 304, 306, and 308 and is not intended to show exact timings for the waveforms.

Waveform 302, labeled "Power Control Signal," may represent the signal 122c generated by the control circuit 122 and used to open and close the switch 126 and control the hold circuit 128. In this example, when waveform 302 is high, the switch 126 may be closed so that power is provided to the GMR bridge 104 and the amplifier 108. Also, when waveform 302 is high, the hold circuit's output signal 128a may track the strength of the magnetic field. When the waveform 302 is low, the switch 126 may be open so that power is decoupled from the GMR bridge 104 and the amplifier 108. Also, when waveform 302 is low, the hold circuit 128 may hold its output signal 128a at a constant value.

The waveform 304, labeled "Low Power Output Signal," may represent the output of the low power path signal amplifier, i.e. the signal 110a in FIG. 1. As discussed above, this signal may represent the strength of the magnetic field as detected by the low power GMR bridge 106.

The waveform 306, labeled "Accurate Output Signal," may represent the signal 108a in the accurate signal path 112, i.e. the input to the hold circuit 128. As discussed above, this signal may represent the strength of the magnetic field as detected by the accurate GMR bridge 104. Note that if the amplifier 108 is omitted from the electronic circuit 100, the signal 108 may be generated directly by the GMR bridge 104. The signal 108a may be undefined when the amplifier 108 or the GMR bridge 104 are decoupled from power, e.g. during time periods prior to T0, between T1 and T2, between T3 and T4, and after T5 in FIG. 3. During these time periods, the signal 108a may be grounded, pulled to a high or low voltage, coupled to a power line, or tri-stated depending upon the design of the circuit 100. However, during these time periods the waveform 306 is shown as grounded for simplicity of illustration.

The waveform 308, labeled "Output" may represent the output signal 100a of the circuit 100.

FIG. 3 also illustrates high thresholds 310, 312, 314, and 316; and low thresholds 318, 320, 322, and 324. High thresholds 310, 312, 314, and 316 may, for example, be thresholds generated by high threshold generator 118 that can be used to determine whether the strength of the magnetic field has increased by more than a predetermined amount. Similarly, low thresholds 318, 320, 322, and 324 may be thresholds generated by low threshold generator 120 that can be used to determine whether the strength of the magnetic field has decreased more than a predetermined amount. When used together, the upper and low thresholds can form threshold windows which, when crossed by the waveform 304, may indicate a change in the strength of the magnetic field. For example, high threshold 310 and low threshold 318 may form a threshold window and the arrangement of the comparators 114 and 116 and the OR gate 123 may be referred to as a window comparator.

In operation, the circuit 100 may use these threshold windows to detect a change in the strength of the magnetic field by more than a predetermined amount, which can be used to determine whether to couple or decouple power from the accurate signal path 112. For example, the strength of the magnetic field (as indicated by the low power signal 110a) is relatively stable and unchanging prior to time T0. Accordingly, prior to time T0, the power control signal 122c may be de-asserted, switch 126 may be open so that the GMR bridge 104 and the amplifier 108 are decoupled from the power supply 102, and the output signal 128a of the hold circuit 128 may be held at a constant value.

At some point prior to time T0, the signal 110a begins to increase until, at time T0, the signal 110a crosses the high threshold 310, indicating that the strength of the magnetic field is changing more than a predetermined amount. Once the signal 110a crosses the high threshold 310 at time T0, the control circuit 122 may assert the power control signal 122c (as shown in the waveform 302) to couple power to the accurate GMR bridge 104 and the amplifier 108. Once the accurate GMR bridge 104 and the amplifier 108 receive power, they may drive the accurate output signal 108a to a level that represents the strength of the magnetic field, as shown in waveform 306 between time T0 and time T1. Additionally, during this time while the power control signal 122c is asserted, the accurate output signal 108a may pass through the hold circuit 128 so that the output signal 100a (in waveform 308) tracks the accurate output signal 108a.

The control circuit 122 may determine whether the strength of the magnetic field has reached a steady state, i.e whether the strength of the magnetic field has remained relatively stable for a predetermined amount of time. In an embodiment, to determine steady state, the control circuit 122 may include a window comparator. The window comparator may detect whether the signal 108a remains within a window (i.e. within a high and low voltage limit). The window may be a fixed window, or a variable window that can be set by the control circuit 122 or an external signal. The high and low limits of the window can be set so that slight variations in the signal 108a (such as noise or other fluctuations of the signal 108a) will not affect the steady state determination.

The control circuit 122 may also include a timer. The control circuit 122 may utilize the window comparator and timer to determine whether the signal 108a has reached a steady state, e.g. whether the signal 108a has remained within the window for a predetermined amount of time.

Once control circuit 122 detects that the strength of the magnetic field has reached a steady state value (for example at time T1), the control circuit 122 may de-assert the power control signal 122c.

Once power control signal 122c is de-asserted by the control circuit 122, power is decoupled from the accurate GMR bridge 104 and the amplifier 108 in order to reduce power consumption. In an embodiment, during those times the amplifier 108 is unpowered, the hold circuit 128 may hold the output signal 100a at its previous, steady state value as is shown to occur in waveform 308 before time T0, between times T1 and T2, between times T3 and T4, and after time T5. As long as the strength of the magnetic field remains relatively constant, the previously measured value will provide an accurate representation of the strength of the magnetic field.

Additionally, once the strength of the magnetic field reaches its new steady state value at time T1, the high threshold generator 118 may set a new high threshold 312 and the low threshold generator 120 may set a new low threshold 320 based upon the new steady state value of the low power output signal 110a. In an embodiment, the new high threshold 312 will be set at a value that is a predetermined amount higher than the new steady state value of low power output signal 110a, and the new low threshold 320 will be set at a value that is a predetermined amount lower than the new steady state value of low power output signal 110a. Once these new thresholds 312 and 320 are set, the control circuit 122 may use the new thresholds 312 and 320 to detect whether a subsequent change to the strength of the magnetic field of greater than a predetermined threshold has occurred.

The control circuit 122 may detect that the strength of the magnetic field has reached steady state in various ways. In an embodiment, the control circuit 122 may determine that the strength of the magnetic field has reached a steady state if the low power output signal 110a or the accurate output signal 108a has remained relatively unchanged (i.e. reached a plateau) for a predetermined amount of time. This can be seen in FIG. 3 just prior to time T1, just prior to time T3, and just prior to time T5, where the accurate output signal 108a reaches a plateau for a relatively short, predetermined time. Once the accurate output signal 108a plateaus for the predetermined time, the control circuit 122 detects that the accurate output signal 108a has reached a steady state and de-asserts the power control signal 122c.

As shown in FIG. 3, the circuit 100 may repeatedly assert the power control signal 122c when the strength of the magnetic field is changing and the low power signal has crossed a threshold. This may allow the output signal 100a to track the strength of the magnetic field during those times (e.g. at times between T0 to T1, between T2 to T3, and between T4 to T5). The circuit 100 may also repeatedly de-assert the power control signal 122c when the strength of the magnetic field has reached a steady state in order to conserve power during those times (e.g. at times prior to T0, between T1 and T2, between T3 and T4, and after T5). In this way, the electronic circuit 100 can use the low power output signal 110a produced by the low power GMR bridge 106 to detect changes in the strength of the magnetic field, and then can provide power to the accurate GMR bridge only when necessary to track the changes.

In an embodiment, the circuit 100 may include hysteresis, for example within the control circuit 122, to reduce the occurrence of the switch 126 turning on and off in too rapid a fashion to produce useful power savings.

Figure 4:
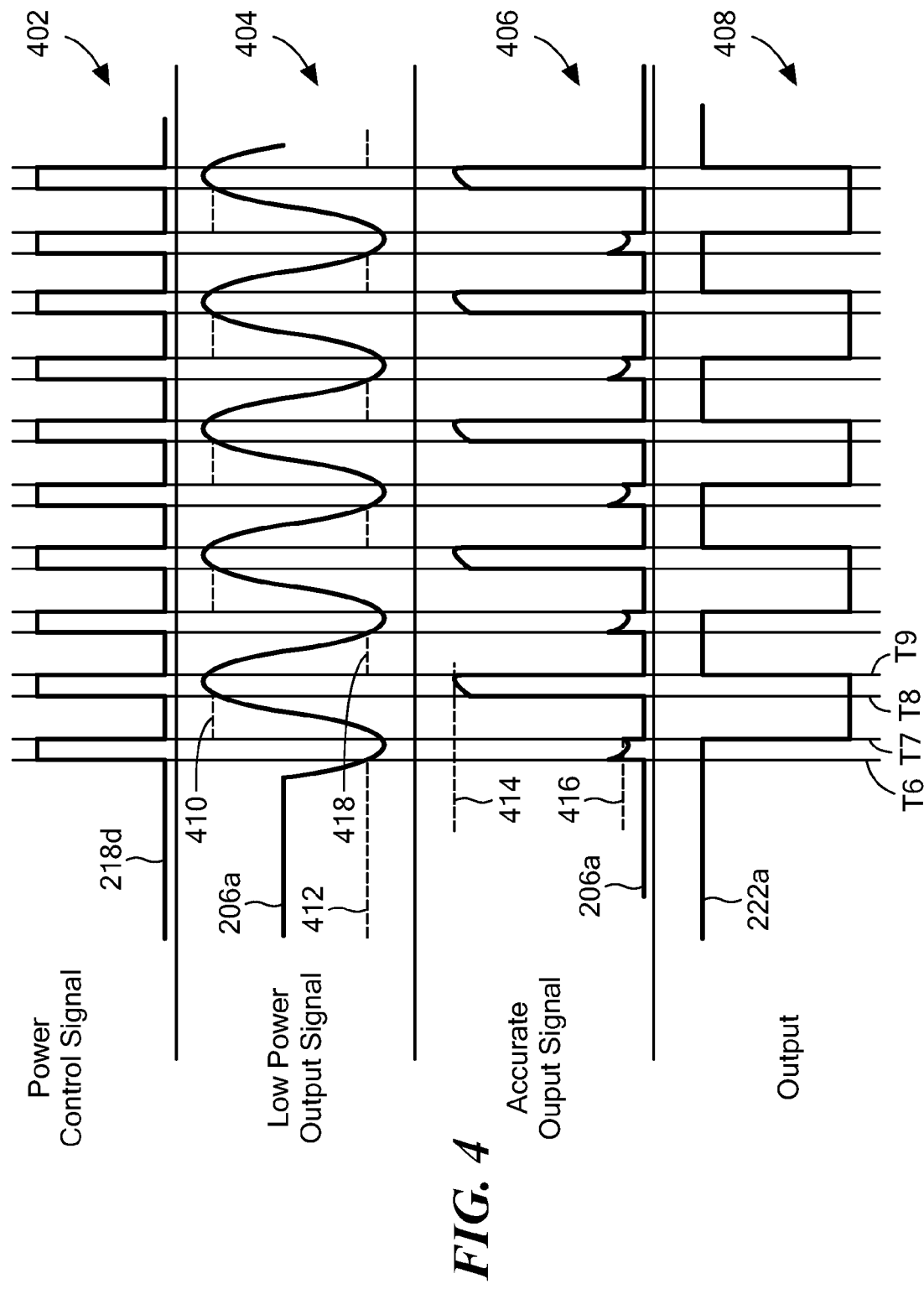
FIG. 4 is a series of waveforms depicting voltages at various nodes within the switched output circuit of FIG. 2.

Referring now to FIG. 4, a series of voltage waveforms 402, 404, 406, and 408 associated with the switched circuit 200 of FIG. 2 are shown. For each waveform, the vertical axis represents voltage. Also, each waveform in FIG. 4 shares a common horizontal axis that represents time. The labels T6-T9 along the horizontal axis denote points in time. It should be noted that FIG. 4 shows approximate timings for the waveforms 402, 404, 406, and 408 and is not intended to show exact timings for the waveforms.

Waveform 402, labeled "Power Control Signal," may represent the control signal 218d generated by the control circuit 218. As described above, the power control signal 218d may control the switch 224. In the example shown in FIG. 4, when the control signal 218d is high, the switch 224 may be closed so that power is provided to the GMR bridge 204 and the amplifier 206. When the control signal 218d is low, the switch 224 may be open so that power is decoupled from the GMR bridge 204 and the amplifier 206. Although not shown, when the control signal 218d is high, the enable signal 218c may also be asserted so that the latch 222 latches in signal 206a, as described above.

The waveform 404, labeled "Low Power Output Signal," may represent the output 207a of the low power signal amplifier 207. As discussed above, this signal 207a may represent the strength of the magnetic field as detected by the low power GMR bridge 202.

The waveform 406, labeled "Accurate Output Signal," may represent the output signal 206a of the amplifier 206 in the accurate signal path 226. As discussed above, this signal may represent the strength of the magnetic field as detected by the accurate GMR bridge 204. Also as discussed above, the output of the amplifier 206 may be undefined when the amplifier 206 and/or the GMR bridge 204 are decoupled from power (e.g. during time periods prior to T6, between T7 and T8, etc). During these time periods, the output of the amplifier 206 may be grounded, pulled to a high or low voltage, coupled to a power supply, or tri-stated depending upon the design of the circuit 200. In FIG. 4, during the times when the signal 206a is undefined, the waveform 406 is shown as grounded for simplicity of illustration.

The waveform 408, labeled "Output," may represent the switched output signal 222a of circuit 200 (or the output signal 200a, which follows the signal 222a).

FIG. 4 also illustrates high threshold 410 and low threshold 412. High threshold 410 may, for example, be a threshold generated by high threshold generator 212 that can be used to determine whether the strength of the magnetic field is increasing or has increased by more than a predetermined amount. Similarly, low threshold 412 may be a threshold generated by low threshold generator 214 that can be used to determine whether the strength of the magnetic field is decreasing or has decreased by more than a predetermined amount.

Additionally, a high peak detection threshold 414 and a low peak detection threshold 416 are shown. The high peak detection threshold 414 and the low peak detection threshold 416 may be set by the peak detector 220, and may be referred to as switching thresholds. These peak detection thresholds 414 and 416 may be used by the peak detector 220 to determine when to toggle the peak detector output 220a, for example based on the signal 206a crossing a threshold that is a percentage of the peak-to-peak magnitude of signal 206a (in the ease of a peak-to-peak percentage detector) or based on the signal 206a differing from a detected peak by a predetermined amount (in the case of a peak-reference detector). In an embodiment, and as shown, the peak detection threshold 414 may be set at a point just after the accurate output signal begins to fall, and the peak detection threshold 416 may be set at a point just after the accurate output signal begins to rise.

In an embodiment, the switching thresholds may be fixed. In other embodiments, the switching thresholds may be adaptive. For example, the switching threshold may be reset by the electronic circuit 200 during each cycle of the magnetic field, at regular predetermined intervals, or at any other time according to design requirements. The electronic circuit 200 may also include hysteresis, for example within the control circuit 218, to reduce the occurrence of the switch 224 turning on and off too rapidly to produce useful power savings.

In operation, the circuit 200 may use the thresholds 410 and 412 to determine when to couple or de-couple power from the accurate GMR bridge 204 and the amplifier 206, and may use the thresholds 414 and 416 to determine when to toggle the switched output signal 200a.

As described above, the amplifier 207, coupled to the low power GMR bridge 202, may produce the low power output signal 207a representing the strength of the magnetic field. Once the low power output signal 207a crosses low threshold 412 at time T6, control circuit 218 may assert the power control signal 218a (as shown by waveform 402) to close switch 224 so that the accurate GMR bridge 204 and the amplifier 206 are coupled to and receive power from power supply 205. Once the accurate GMR bridge 204 and the amplifier 206 receive power, the amplifier 206 may provide accurate output signal 206a, as shown in waveform 406, between times T6 and T7.

While the amplifier 206 is receiving power, the peak detector 220 may monitor the accurate output signal 206a and compare the accurate output signal 206a to switching thresholds 414 and 416 to determine if the strength of the magnetic field has reached a peak.

Once the peak detector 220 has detected that the accurate output signal 206a has reached a lower peak at time T7, the control circuit 218 may assert the enable signal 218c so that the buffer 222 latches the accurate output signal 206a and drives the output signal 200a low. Also, once the lower peak has been detected at time T7, the control circuit may open the switch 224 so that power is decoupled from the accurate GMR bridge 204 and the amplifier 206. Additionally, at time T7, the high threshold generator 212 may generate the high threshold 410 so that electronic circuit 200 can subsequently detect when the strength of the magnetic field crosses the high threshold 410, i.e. when the strength of the magnetic field has changed by more than a predetermined threshold.

As long as the strength of the magnetic field remains between low threshold 412 and high threshold 410, the control signal 218d can remain low and power can remain decoupled from the accurate GMR bridge 204 and the amplifier 206. During this time, when power is de-coupled, the accurate output signal 206a can remain undefined, as shown by waveform 406 between time T7 and T8.

Once the low power output signal 206a (waveform 404) crosses the high threshold 410 at time T8, the control circuit 218 may once again assert the control signal 218d (waveform 402) and close the switch 224 so that power is coupled to the accurate GMR bridge 204 and the amplifier 206. This may allow the amplifier 206 to drive the accurate output signal 206a (waveform 406) so that the peak detector 220 can establish peak threshold 414 and determine whether the accurate output signal 414 has reached a desired condition, such as a peak. Once the accurate output signal 206a reaches a positive peak at time T9, the buffer 222 can toggle the output signal 200a (waveform 408), control circuit 218 can de-assert the control signal 218d (waveform 402), the low threshold generator 214 can establish a new low threshold 418 (waveform 404), and the accurate output signal 206a may be tri-stated or otherwise undefined (waveform 406).

Figure 5:
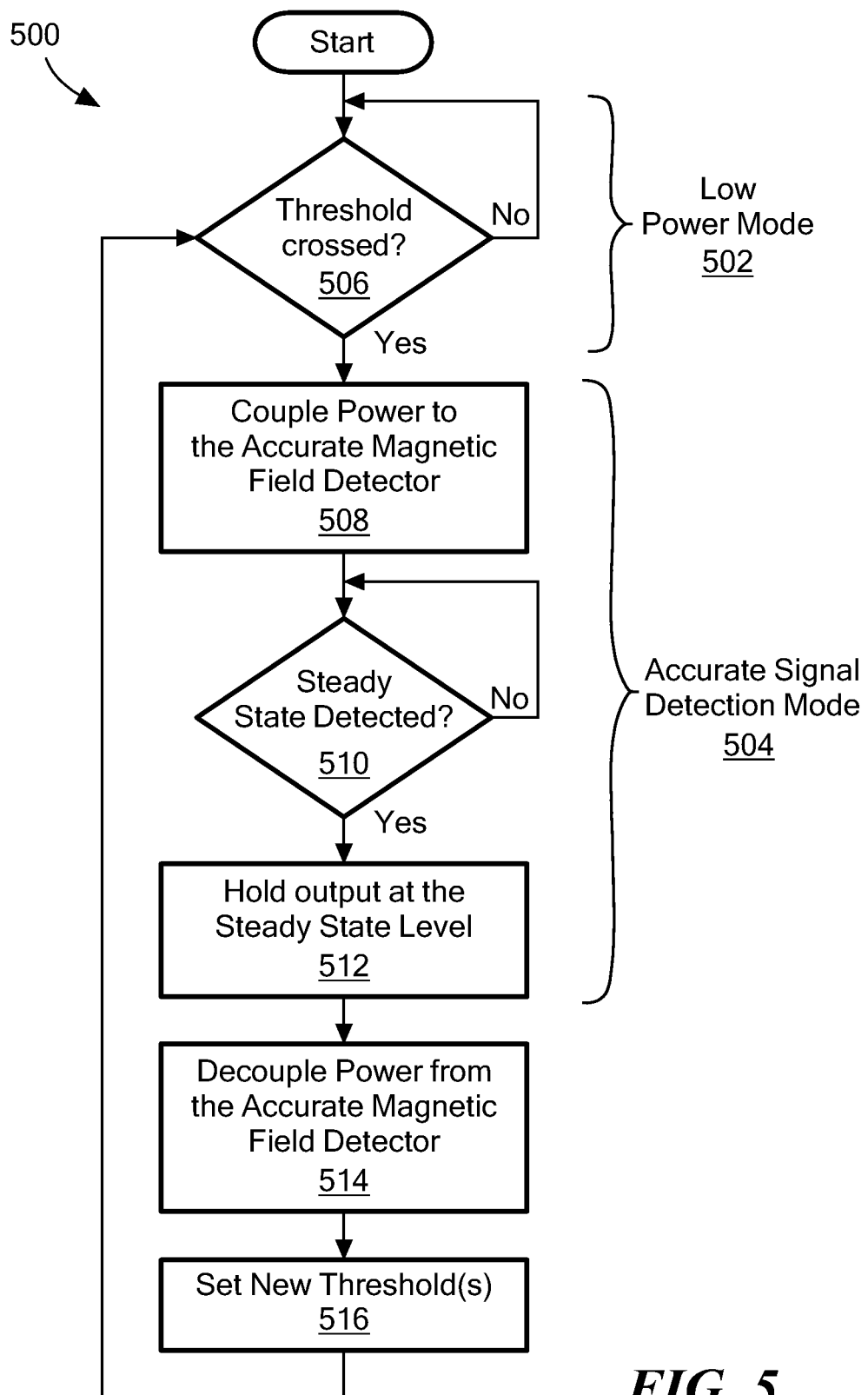
FIG. 5 is a flowchart depicting a process for defecting a magnetic field and producing a linear output representing the strength of the magnetic field.

Referring now to FIG. 5, a flowchart is shown depicting a process 500 for detecting the strength of a magnetic field. In an embodiment, the process 500 may be implemented by the circuit 100 (FIG. 1).

The process 500 may comprise a low power mode 502 and an accurate signal detection mode 504. In the low power mode 502, the process 500 may detect whether the strength of a magnetic field has crossed a threshold, as shown by decision block 506. In an embodiment, the process 500 may use a low power detection circuit (e.g. the low power GMR bridge 106) to determine whether the strength of the magnetic field has crossed the threshold.

Once the threshold has been crossed, the process 500 may exit the low power mode 502 and enter the accurate signal detection mode 504. In the accurate signal detection mode 504, the process 500 may couple power to an accurate magnetic field detector (e.g. the accurate GMR bridge 104), as shown by block 508. After power is coupled in block 508, an output signal generated by the process 500 may track the output of the accurate magnetic field detector.

Once power is coupled in block 508, the process 500 may detect whether the output of the accurate magnetic field detector has reached a steady state, as shown by decision block 510.

When the process 500 detects the steady state, the process 500 may hold the output signal at the steady state level, as shown by block 512, and may decouple power from the accurate magnetic field detector in order to reduce power consumption, as shown by block 514. The process may then set a new threshold based on the steady state level, as shown by block 516. After the new threshold is set, the process may proceed to block 506 to determine whether the strength of the magnetic field has crossed the newly-set thresholds.

Figure 6:
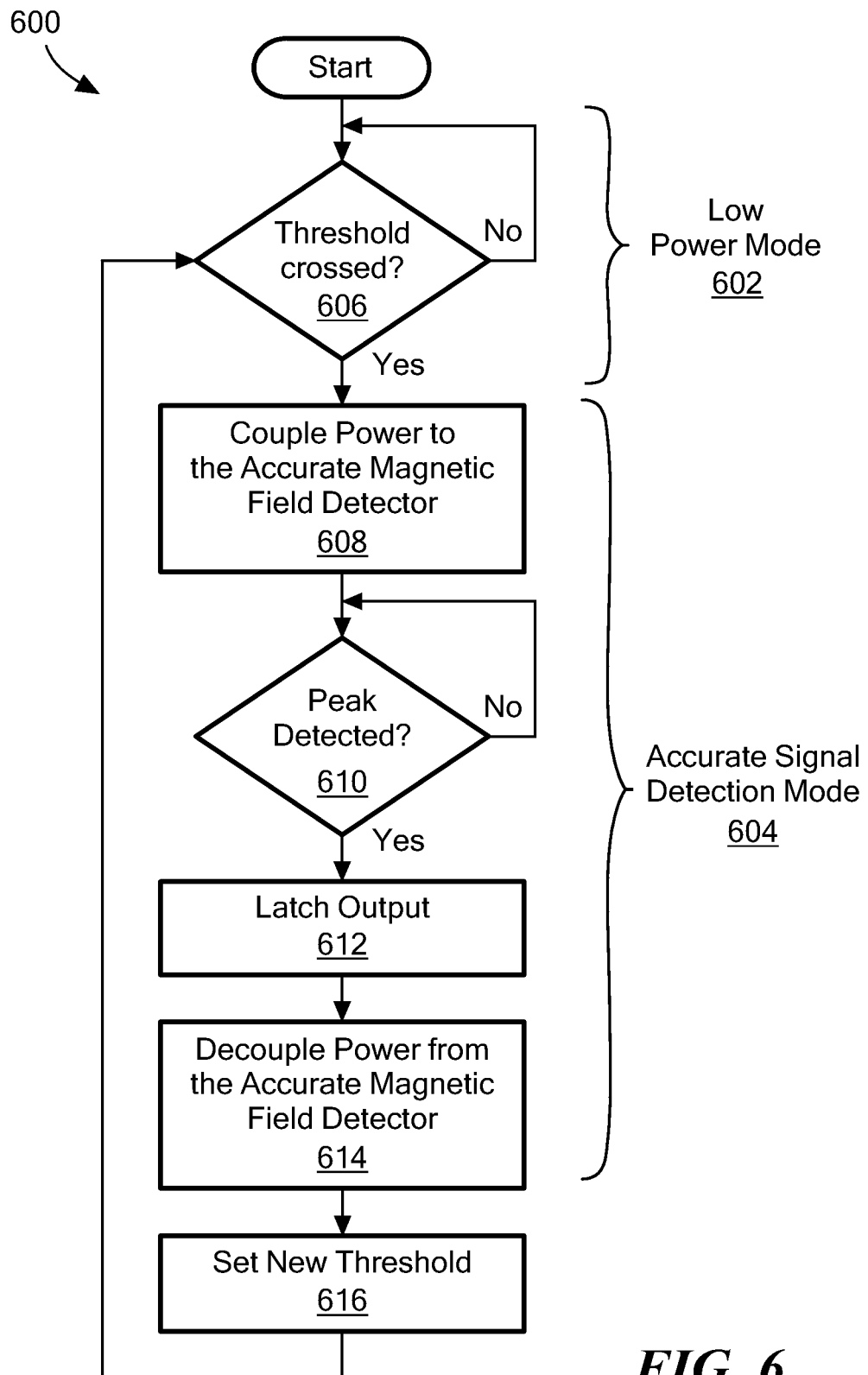
FIG. 6 is a flowchart depicting a process for detecting a magnetic field and producing a switched output representing the strength of the magnetic field.

Referring now to FIG. 6, a flowchart is shown depicting a process 600 for detecting the strength of a magnetic field. In an embodiment, the process 600 may be implemented by circuit 200 (FIG. 2).

The process 600 may comprise a low power mode 602 and an accurate signal detection mode 604. In the low power mode 602, the process 600 may detect whether the strength of a magnetic field has crossed a threshold, as shown by decision block 606. When the threshold is crossed, it may indicate that the strength of the magnetic field has changed more than a predetermined threshold. In an embodiment, the process 600 may use a low power detection circuit to determine whether the strength of the magnetic field has crossed a threshold.

Once the threshold has been crossed, the process 600 may exit the low power mode 602 and enter the accurate signal detection mode 604. In the accurate signal detection mode 604, the process 600 may couple power to an accurate magnetic field detector (e.g. the accurate GMR bridge 204), as shown by block 608.

Once power is coupled in block 608, the process 600 may detect whether the output of the accurate magnetic field detector has reached a peak, as shown by decision block 610.

When the process 600 detects the peak in decision block 610, the process 600 may latch and hold the output signal, as shown by block 612. If the strength of the magnetic field is high, the process 600 may latch a high output. Conversely, if the strength of the magnetic field is low, the process 600 may latch a low output.

The process 600 may then decouple power from the accurate magnetic field detector in order to reduce power consumption, as shown by block 614. The process 600 may then set new thresholds to detect a subsequent change in the strength of the magnetic field, as shown by block 616. After the new threshold is set, the process may proceed to block 606 to determine whether the strength of the magnetic field has crossed the newly-set thresholds. Embodiments of the technology can be used in any application where detection of a magnetic field is needed. For example, the technology can be used to detect the position or speed of a motor, a position of an actuator, a proximity of a magnet, etc. Because the systems and methods described can reduce power consumption, embodiments of the technology may be beneficial in applications where low power consumption is desired, such as applications that are powered by a battery, by solar power, etc.

Although certain signals or elements may be described herein specifically as analog or digital, it is understood that analog signals and elements can be replaced by digital signals and elements and vice versa. Either analog or digital elements can be replaced, by other equivalent elements, signals, or circuits where appropriate and as desired by the circuit design.

The figures and drawings included and described above provide examples of embodiments of the invention, and are not intended to limit the scope of the invention. Elements within schematic figures can be rearranged, replaced, or reconnected in any appropriate manner. Unless otherwise specified, waveforms and other timing diagrams provide example timings only and are included for the purpose of explanation. Such waveforms do not necessarily illustrate exact timing or sequencing of any signals or waveforms. Flowcharts and other process diagrams likewise provide examples only. Sequences shown in flowcharts provide examples of embodiments of the invention. Blocks and other elements within any included flowcharts and can be rearranged and re-ordered in any appropriate manner within the scope of the invention.

Having described various embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that scope of the patent should not be limited to the described embodiments but rather should be limited only by the spirit and scope of the following claims.

What is claimed is:

1. An electronic circuit comprising:
    a first magnetic field detection circuit that produces a first signal indicating a strength of a magnetic field;
    a second magnetic field detection circuit that selectively receives a power signal and produces a second signal indicating the strength of the magnetic field, wherein the second signal provides a more accurate indication of the strength of the magnetic field than the first signal; and
    a control circuit configured to determine whether the first signal indicates a change greater than a predetermined amount in the strength of the magnetic field and to couple the power signal to the second magnetic field detection circuit in response to a determination that the strength of the magnetic field has changed by greater than the predetermined amount;
    an output circuit that provides, as an output of the electronic circuit, an output signal that is based only on the second signal produced by the second magnetic field detection circuit while the second magnetic field detection circuit is receiving power.

2. The electronic circuit of claim 1 wherein the first magnetic field detection circuit consumes less power than the second magnetic field detection circuit.

3. The electronic circuit of claim 1 further comprising an output circuit that provides, as an output of the electronic circuit, an output signal based on the second signal from the second magnetic field detection circuit, the output signal indicating the strength of the magnetic field.

4. The electronic circuit of claim 3 wherein the output signal tracks the second signal while the second magnetic field detection circuit is receiving power and wherein the output circuit comprises a hold circuit configured to hold a previous value of the output signal while the second magnetic field detection circuit is not receiving power.

5. The electronic circuit of claim 1 further comprising an output circuit that provides, as an output of the electronic circuit, an output signal based on the second signal from the second magnetic field detection circuit, the output signal comprising transitions indicating when the magnitude of the second signal crosses a switching threshold.

6. The electronic circuit of claim 1 wherein the first magnetic field detection circuit, the second magnetic field detection circuit, or both, comprises one or more of: a magnetoresistance element, a giant magnetoresistance element, a Hall effect element, a CVH element, an AMR element, a GMR bridge, and AMR bridge or a combination thereof.

7. The electronic circuit of claim 1 wherein the control circuit is configured to determine whether the second signal has reached a steady state or a peak and to decouple the power signal from the second magnetic field detection circuit in response to a determination that the second signal has reached the steady state or the peak.

8. The electronic circuit of claim 7 wherein the control circuit determines whether the second signal has reached a steady state by determining whether the second signal has changed during a predetermined period of time.

9. The electronic circuit of claim 5 wherein the control circuit is configured to decouple the power signal from the second magnetic field detection circuit in response to a transition of the output signal.

10. A method comprising:
   producing, with a first magnetic field detection circuit comprising a first circuit path, a first signal indicating a strength of a magnetic field;
   determining whether the first signal indicates a change in the magnetic field greater than a predetermined amount;
   producing, with a second magnetic field detection circuit comprising a second circuit path, a second signal indicating the strength of the magnetic field, wherein the second signal provides a more accurate indication of the strength of the magnetic field than the first signal; and
   providing a power signal to the second magnetic field detection circuit if the first signal indicates a change in the magnetic field greater than the predetermined amount;
   wherein the first circuit path comprises one or more circuit elements, the second circuit path comprises one or more circuit elements, and the circuit elements of the first circuit path are different elements than the circuit elements of the second circuit path.

11. The method of claim 10 wherein the first magnetic field detection circuit consumes less power than the second magnetic field detection circuit.

12. The method of claim 10 further comprising providing an output signal based on the second signal from the second magnetic field detection circuit, the output signal indicating the strength of the magnetic field.

13. The method of claim 12 wherein the output signal tracks the second signal while the second magnetic field detection circuit is receiving power and is provided by a previous value of the output signal while the second circuit is not receiving power.

14. The method of claim 10 further comprising providing an output signal based on the second signal from the second magnetic field detection circuit, the output signal comprising transitions indicating when the magnitude of the second signal crosses a switching threshold.

15. The method of claim 10 wherein the first magnetic field detection circuit, the second magnetic field detection circuit, or both, comprises one or more of: a magnetoresistance element, a giant magnetoresistance element, a Hall effect element, a CVH element, an AMR element, a GMR bridge, and AMR bridge, or a combination thereof.

16. The method of claim 10 further comprising determining whether the second signal has reached a steady state or a peak and decoupling the power signal from the second magnetic field detection circuit in response to a determination that the second signal has reached the steady state or the peak.

17. The method of claim 16 further comprising determining whether the second signal has reached the steady state by determining whether the second signal has changed during a predetermined period of time.

18. The method of claim 14 further comprising decoupling the power signal from the second magnetic field detection circuit in response to a transition of the output signal.

19. An electronic circuit comprising:
   a first magnetic field detection circuit comprising a first circuit path that produces a first signal indicating a strength of a magnetic field;
   a second magnetic field detection circuit comprising a second circuit path that selectively receives a power signal and produces a second signal indicating the strength of the magnetic field, wherein the second signal provides a more accurate indication of the strength of the magnetic field than the first signal; and
   a control circuit configured to couple the power signal to the second magnetic field detection circuit in response to the first signal crossing either a high threshold or a low threshold;
   wherein the first circuit path comprises one or more circuit elements, the second circuit path comprises one or more circuit elements, and the circuit elements of the first circuit path are different elements than the circuit elements of the second circuit path.

20. The electronic circuit of claim 19 further comprising one or more threshold generator circuits to establish the high threshold and the low threshold.

21. The electronic circuit of claim 20 wherein the one or more threshold generator circuits establish the high threshold and/or the low threshold during operation of the electronic circuit.

22. The electronic circuit of claim 20 wherein the one or more threshold generator circuits reestablish the high threshold and/or the low threshold during each cycle of the magnetic field or at predetermined time intervals.

23. The electronic circuit of claim 19 wherein the control circuit is configured to couple the power signal to the second magnetic field detection circuit in response to a determination that the strength of the magnetic field has changed by greater than a predetermined amount.

* * * * *

UNITED STATES PATENT AND TRADEMARK OFFICE
CERTIFICATE OF CORRECTION

PATENT NO.        : 9,625,534 B2
APPLICATION NO.   : 13/682921
DATED             : April 18, 2017
INVENTOR(S)       : Bryan Cadugan et al.

It is certified that error appears in the above-identified patent and that said Letters Patent is hereby corrected as shown below:

Column 7, Line 40 and Column 7, Line 50: replace "The GMR Bridge" with --The GMR bridge--

Column 14, Line 34: replace "414" with --206a--

Signed and Sealed this
Twenty-fourth Day of April, 2018

Andrei Iancu
*Director of the United States Patent and Trademark Office*